United States Patent [19]

Cuzin et al.

[11] Patent Number: 4,933,634
[45] Date of Patent: Jun. 12, 1990

[54] DEVICE AND METHOD TO MEASURE A SHORT RADIATION PULSE OR AN ELECTRIC PULSE

[75] Inventors: Marc Cuzin, La Tronche; Edouard Rossa, Gex, both of France

[73] Assignee: Commissariat a l'Energie Atomique, Paris, France

[21] Appl. No.: 300,086

[22] Filed: Jan. 19, 1989

[30] Foreign Application Priority Data

Jan. 22, 1988 [FR] France ................ 88 00694

[51] Int. Cl.⁵ .......................................... G01R 31/26
[52] U.S. Cl. ............................. 324/158 R; 324/77 A; 324/158 D; 324/96
[58] Field of Search ............ 324/158 R, 158 D, 77 K, 324/96, 83 D, 77 A, 102; 250/227

[56] References Cited

U.S. PATENT DOCUMENTS 3,278,846 10/1966 Patten et al. .................. 324/77 A
4,168,467 9/1979 Bailey et al. .................. 324/83 D
4,480,192 10/1984 Albrecht et al. ............... 324/77 K
4,482,863 11/1984 Auston et al. .................. 324/158 D
4,745,361 5/1988 Nees et al. ..................... 324/77 K Primary Examiner—Reinhard J. Eisenzopf
Assistant Examiner—Vinh P. Nguyen
Attorney, Agent, or Firm—Nutter, McClennen & Fish

[57] ABSTRACT

A device for measuring a single short pulse includes at least one measuring unit (D1, Dn) comprising a conductive line (L) connected to a set of photoconductors (A, B1-Bp), the line and photoconductors being placed between two nonconductors forming a single support in which the length of the line (x1) separating the photoconductors two-by-two is equal to the product of the propagation speed on the line with respect to the duration of the pulse concerning the number of measurement points, the lifetime of the majority carriers of the photoconductors being selected as being equal to or less than 10% of the duration of the pulse. The device makes it possible to obtain a temporal analysis or the autocorrelation of the pulse which may be an electromagnetic radiation or ionizing pulse or an electric pulse.

10 Claims, 3 Drawing Sheets

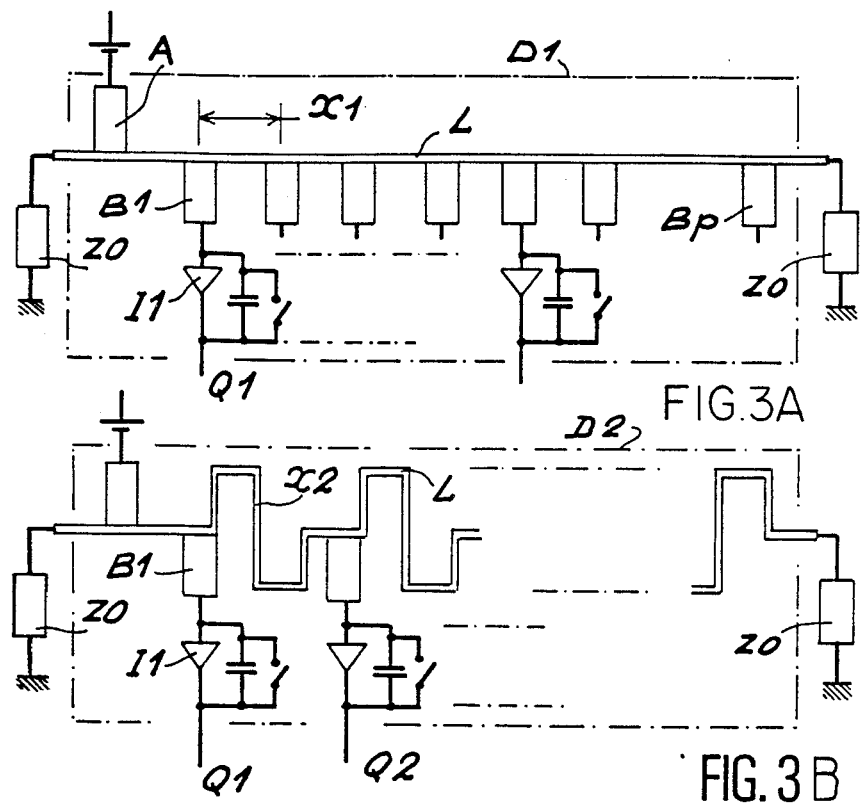
FIG. 3A
FIG. 3B
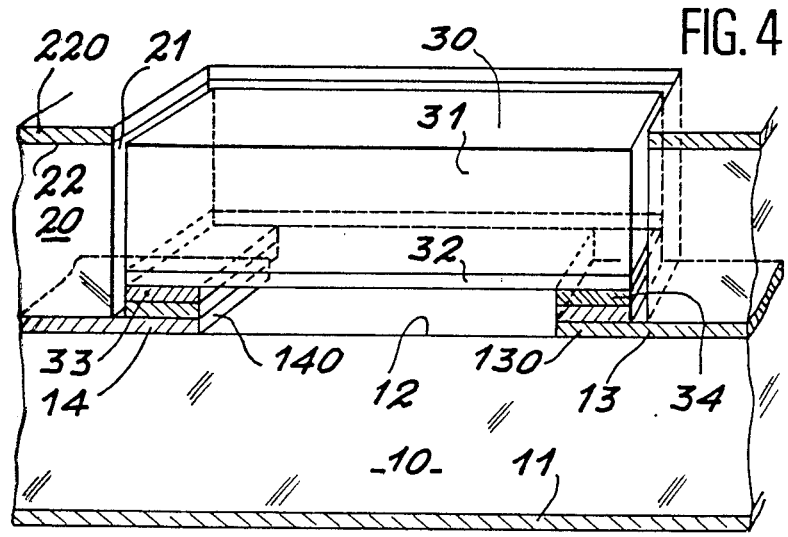
FIG. 4

DEVICE AND METHOD TO MEASURE A SHORT RADIATION PULSE OR AN ELECTRIC PULSE

FIELD OF THE INVENTION

The object of the invention is to provide a device and a method to measure a short radiation pulse or an electric pulse which, from a single pulse, makes it possible to know either its autocorrelation function or its temporal form.

BACKGROUND OF THE INVENTION

Short pulses are understood to be pulses whose duration may range from 1 to 1000 picoseconds. When the pulse to be analyzed is a short but repetitive pulse, normally a sampling of this pulse is taken by means of using a sampling oscilloscope which samples part of the information from each pulse and thus, via this part, constructs the form of the pulse. This sampling technique may only be applied to repetitive pulses.

In the case of short but non-repetitive pulses, a slit scanning camera is traditionally used in which display of the phenomenon onto a storage tube linked to an electronic deflection has a temporal revolution close to a picosecond for photonic pulses (X-rays, infrared or visible ultraviolet rays). However, the use of such a slit scanning camera cannot be easily implemented in certain usages owing to the large geometrical dimensions of the camera. Moreover, this camera is costly and secondly it is difficult to exploit the image supplied as the latter needs to be retaken by another camera.

The method is also known for using an electro-optical autocorrelating device in order to measure a nonrepetitive short pulse or a repetitive but coherent pulse. Such autocorrelators use non-linear crystals which make it possible to reach the sub-picosecond field. However, such autocorrelators may only be used for coherent light pulses.

Furthermore, a multichannel autocorrelator exists which is embodied from photoconductors connected to lines for the propagation of electric signals generated by the photoconductors. Such an autocorrelator was exhibited at San Diego in August 1987. However, such a correlator does not make it possible to give the form of a pulse in a single shot, in other words from a single pulse in the case where the pulse is an electric pulse. Moreover, in the case of electromagnetic pulses, this device may only be used for a predetermined range of pulse durations, the limited number of points of the autocorrelation function being linked to a pulse whose average duration is known. Furthermore, this aforementioned device comprises as many delay lines as many as the measuring points of the autocorrelation function. The various photoconductors associated with each delay line only allow for temporal measurements very close to each other to be made and only make it possible to know the inclination of the incident beam with respect to its axis of propagation. This axis is assumed to be perpendicular to the plane of the detector photoconductors. The various delay lines have different lengths so as to obtain various points of the autocorrelation function of a pulse.

Via the U.S. Pat. No. 4,482,863, a device is known which measures the transfer function of a circuit, this device comprising a single delay line along which and disposed several photoconductive elements. These elements are spaced at regular intervals on the delay line so as to introduce equal times for propagating the electric wave circulating on this line between the various photoconductors. Various points of the temporal form of an electric pulse are thus obtained.

In the device described in this patent, the photoconductive elements and the lines for propagating the electric signals are surface-technology (substrate strip). This presents action significantly limits the useable polarization voltages, failing which ionization of the air between the electrodes close to the photoconductive elements introduces a parasitic current capable of introducing ill-timed breakdowns. This limitation introduces a significant loss of sensitivity which explains the need function with repetitive pulses. Thus, this device makes it possible to carry out by sampling an analysis of the electric pulse by optically introducing the delay required for the sampling function.

Moreover, it is necessary that optics be associated with the device so as to delay the entry of the optical pulse required in order to analyze each photoconductor.

As a result, no device of the prior art makes it possible to obtain either the temporal analysis or autocorrelation function of a short electromagnetic radiation or ionizing pulse in a single go, or the temporal form of an electric pulse.

SUMMARY OF THE INVENTION

The object of the present invention is to overcome these drawbacks. The present device for measuring a single short pulse includes at least one measuring unit suitable for carrying out p measuring points of a pulse of duration $\theta$ and comprising a conductive line to which is connected, via one of their electrodes, a set of photoconductors, the line and photoconductors being placed between two nonconductors and wherein the line length separating the photoconductors two-by-two is equal to the product of the propagation speed on this line by are the ratio $\theta/p$, the photoconductors being selected so that the lifetime of the majority carriers of the photoconductors them is less than or equal to 10% of the duration of the pulse to be analyzed. The device thus makes it possible to obtain a temporal analysis or the autocorrelation function of either a radiation pulse or an electric pulse.

The object of the invention is also to provide a pulse measuring device comprising a plurality of measuring units for which the lifetime $\tau$ of the majority carriers of the photoconductors differs from one unit to another so as to obtain identical sensitivity for different pulse durations.

The invention also concerns a device for measuring a short pulse in which each measuring unit comprises $p+1$ photoconductors, the lifetime $\tau$ of the majority carriers being less than or equal to 10% of $\theta$ so as to have p measurement points for a pulse of duration $\theta$.

According to one particular embodiment, the measuring device comprises a first substrate including a first metallized face and a second face opposite the first one on which are disposed tracks and a conductive line roughly perpendicular to the tracks and spaced from the latter. The device also comprises a second substrate placed on the tracks and the conductive line, this second substrate including openings whose lengths are greater than the space existing between the conductive line and the tracks and being covered with a metallized coating. The photoconductors are constituted by blocks including a substrate on which disposed a semiconductive coat and then a first contact and a second contact placed on the semiconductive coat at each of the extremities of the block, each block having dimensions so that it may be housed inside an opening of the second substrate, one contact being placed on the conductive line, the other being placed on one track.

According to one preferred embodiment of the measuring device, the photoconductors comprise a semiconductive coat constituted by cadmium telluride or gallium arsenide or indium phosphide.

The invention also concerns a method for measuring a pulse whereby a measurement device according to the invention is used and for which the conductive line is closed at each of its extremities by virtue of its characteristic impedance and into which a short radiation pulse E(t) is sent, the first photoconductor being polarized by a predetermined d.c. voltage, an image electric signal S(t) of the incident pulse E(t) being sent through the line so that $S(t)=KE(t)$, the signal S(t) polarizing the second photoconductor. The photoconductor thereupon generates a current proportional to the convolution product of the pulse E(t) and its delayed image $E_1(t)$, $E_1(t)=E(t+x/v)$ where x is the length of the line separating these two first photoconductors, v is the propagation speed on the line, x being selected so that the delay x/v is equal to $\theta/p$, with photoconductors in which the lifetime of the majority carriers is less than or equal to 10% of $\theta$. The signal S(t) successively polarizes in the same way all the other photoconductors with a delay increased each time by $\theta/p$, a load Qi being a resultant of these convolution products and collected at the output of each photoconductor, each load thus providing the measurement of a point of the autocorrelation function of the pulse to be measured.

The invention also concerns a method for measuring a pulse whereby the device of the invention is used and in which the conductive line is closed at its two extremities by virtue of its characteristic impedance, whereby a short radiation pulse is sent to illuminate all the photoconductors and, in synchronism with this pulse, a shorter radiation pulse whose duration is roughly equal to or less than the lifetime of the majority carriers of the photoconductors is sent onto the first photoconductor, this photoconductor being polarized by a predetermined d.c. voltage. A set of loads corresponding to a sampling of the radiation pulse to be analyzed is obtained, each load being recovered on an output electrode of each photoconductor, except for the first one.

According to one variant, the method may be employed inversely by sending a very short radiation pulse onto all the photoconductors and a short radiation pulse to be analyzed onto the first photoconductor.

Thus, the temporal form of the pulse to be analyzed is obtained with a temporal resolution equal to the lifetime of the carriers present in the photoconductors.

The invention also concerns a method for measuring a short pulse whereby a device according to the invention is used and whereby the conductive line connected to p photoconductors is closed via its characteristic impedance at a single extremity and whereby a short electric pulse is sent to be analyzed on the other extremity, a shorter radiation pulse being sent onto these photoconductors in synchronism with the electric pulse, the duration of the radiation pulse being roughly equal to or less than the lifetime of the majority carriers of the photoconductors, a set of charges corresponding to a sampling of the electric pulse to be analyzed being obtained, each charge being recovered on one output electrode of each photoconductor.

BRIEF DESCRIPTION OF THE DRAWINGS

Other advantages and characteristics of the invention shall be more readily understood upon reading the following detailed description with reference to the accompanying drawings in which:

FIG. 3 shows an electrical diagram of two elements according to FIG. 2, FIG. 4 shows a diagram of an example of a photoconductor and its positioning in a device according to the invention.

DETAILED DESCRIPTION OF THE PREFERRED EMBODIMENTS

Figure 1:
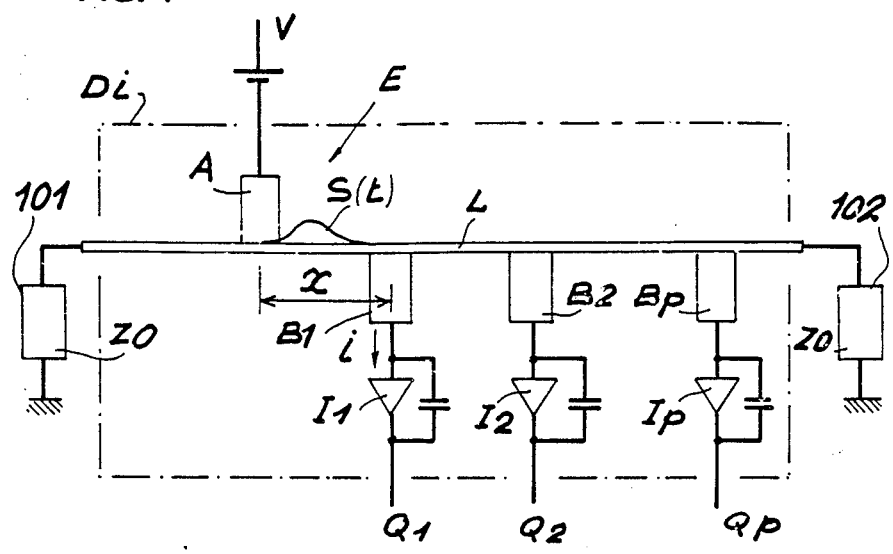
FIG. 1 shows an electrical diagram of the device according to the invention.

The device for measuring a short pulse is shown in FIG. 1 by means of its electrical diagram. This measuring device comprises a conductive line L closed at its two extremities 101 and 102 via its characteristic impedance ZO. A first photoconductor A is connected firstly to this line L and secondly to a polarization voltage V. p photoconductors Bl-Bp are connected firstly to this line L and secondly to integrating amplifiers I1, I2, . . . , Ip, the photoconductor B1 being connected to an integrating amplifier I1, B2 to I2 and Bp to Ip. The device also comprises p outputs Q1-Qp, each output corresponding to one output of an integrating amplifier. The distance x between each photoconductor is selected to be equal to the product $v.(\theta/p)$ where v represents the propagation speed of a wave on the line L and $\theta$ the duration of the pulse to be analyzed E(t). The lifetime of the majority carriers of each photoconductor is selected so that it is less than or equal to 10% of the period $\theta$. Thus, when a short radiation pulse E is sent onto the photoconductors, the photoconductor A, which is polarized by a predetermined voltage V, sends through the line L an electric signal representative of the incident pulse E(t) so that S(t) is equal to $S(t)=kE(t)$, the signal S(t) polarizing the second photoconductor. The second photoconductor thereupon generates a current i proportional to the convolution product of the pulse and its delayed image $E_1(t)$ where $E_1(t)$ is equal to $E(t+x/v)$, x being the length of the line separating the photoconductors from each other, v the propagation speed of the line and x being selected so that the delay x/v is equal to the duration $\theta/p$ in order to obtain p measuring points equidistant from a pulse of duration $\theta$. The distance between two photoconductors is thus selected so that it introduces a delay equal to the desired time interval between two successive points of the temporal analysis.

The device according to the invention may also comprise a unit such as the one shown in FIG. 1 and which bears the reference Di. According to one variant, it may also comprise a plurality of units Di, i ranging from 1 to n, this being illustrated in FIG. 2. These units are embodied on a given support SP. The lifetime of the majority carriers of the photoconductors of each measuring unit Di shall differ from one unit to another and, for example, a lifetime $\tau$, shall be selected for the unit D1, $\tau2 > \tau1$ for unit D2 and $\tau n$ for the unit Dn. For example, $\tau1 = 10$ p.s is selected for the first unit D1, $\tau2 = 20$ ps for the first unit D2 and $\tau n = 50$ ps for the final unit Dn. Thus, identical sensitivity is obtained for different pulse durations.

Each unit has a number of photoconductors equal to p+1. If a number p equal to 10 is selected, the first unit shall provide 10 measuring points for a pulse of 100 ps while the second unit shall provide 5 measuring points for this same pulse and, on the other hand, this second unit shall provide 10 measuring points for a pulse of 200 ps.

However, each measuring unit must strictly not have the same number of photoconductors.

Figure 2:
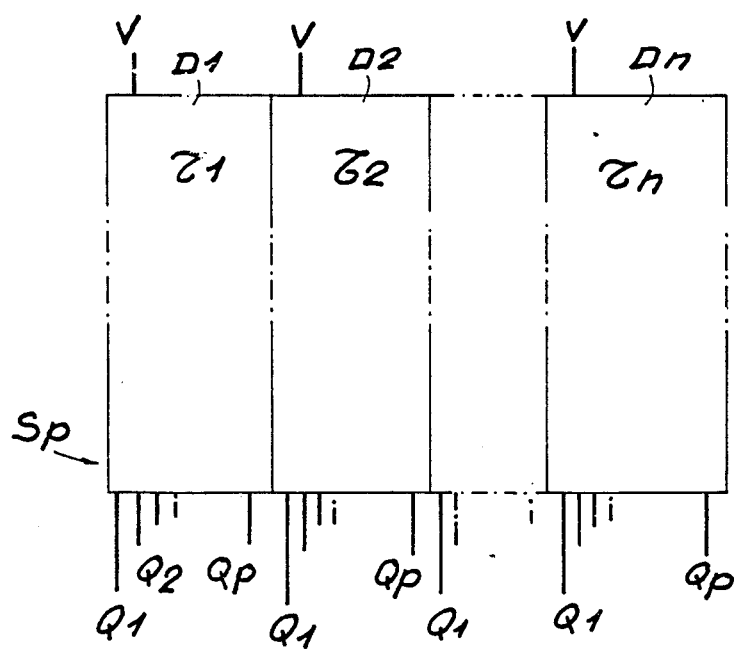
FIG. 2 shows a skeleton diagram of the device according to the invention for the measurement of pulses of different durations.

FIG. 3A shows the electrical diagram of a device according to the invention corresponding to the unit D1 of FIG. 2.

FIG. 3B shows the electrical diagram of a device according to the invention corresponding to the unit D2 of this same FIG. 2.

FIG. 3A shows all the photoconductors A, B1, B2 and Bp having a lifetime equal to $\tau1$, whereas FIG. 3B shows that these photoconductors A, B1 and Bp have majority carriers whose lifetime is equal to $\tau2$. The current-carrying electric path on the line of the unit D1 between two photoconductors B1, B2 or B2, B3 ... is equal to x1, this path being equal to the length of the line between two adjacent photoconductors and being selected as equal to the product of the propagation speed on the line by the desired time interval $\theta A/p$ between two points of the temporal analysis of a pulse of duration $\theta$ A. For a lifetime $\tau2 > \tau1$, distances between photoconductors shall have $x2 > x1$ as can be seen on FIG. 3B, $x2 = v \cdot (\theta\beta/p)$ in order to carry out a temporal analysis of a pulse of duration $\theta$ $\beta$. The photoconductors are selected so as to have high resistivity in the absence of radiation ($> 10^8 \rho$ cm) so that the device possesses sound dynamics. In fact, the charges accumulated by the outputs Qi in the absence of lighting are directly linked to the resistance of the type A and type B photoconductor elements regarded as being serial-polarized.

Moreover, as sensitivity is proportional to the polarization voltage, it is preferable to use a high value for this polarization voltage, a high resistivity being required to ensure sound electric field behavior.

FIG. 4 shows the structure of the device of the invention and an embodiment according to the invention whereby the line and photoconductors are found on a given support between two nonconductors, one of the nonconductors possibly being a gas or a vacuum. This structure comprises a first substrate 10, which has an entirely metallized first face 11 constituting a layout plane, and which has a partially metallized second face 12. The metallized parts firstly constitute a set of tracks 13 on which connected the integrating amplifiers I1-Ip in order to form the outputs Q1, Q2 and Qp of each unit shown on FIGS. 3A and 3B. These metallized zones also comprise a track 14 perpendicular to the tracks 13, this track 14 constituting the conductive line L seen in FIGS. 3A and 3B. The conductive track 14 is located at a predetermined distance from the extremities of the tracks 13 so that there is no contact between the latter.

Above this first substrate 10, a second substrate 20 is placed, said second substrate comprising a set of openings whose length is larger than the space existing between the conductive track 14 and the tracks 13, so that a zone 140 of the track 14 is not covered by the substrate 20 and so that a zone 130 of a given track 13 opposite the track 14 is also not covered by this substrate 20. The face of the substrate 20 opposite the metallized face 12 of the substrate 10 is also provided with a metallized coating 220. Each photoconductor is formed as a block 30 whose dimensions enable it to be housed inside an opening 21 of the substrate 20. The block 30 is constituted by a substrate 31 on which a coat of a semiconductive material 32 is deposited. Above this semiconductive material and at each of the extremities of the block, a contact 33 and a contact 34 are disposed. When the block is placed into the opening, the contact 33 is laid onto the zone 140 of the conductive track 14 and the contact 34 is laid onto the zone 130 of a track 13.

According to an embodiment example invention, each detection unit, namely each photoconductor, appears in the form of a quartz block 125 $\mu$m in thickness, 200 $\mu$m in width and 800 $\mu$m in length, on which coated is a deposit of cadmium telluride about 10 $\mu$m thick, the zones 140 and 130 having a width of 100 $\mu$m so as to allow for contact with the block. Each block is mounted or glued by lacquer to the silver on the tracks 14 and 13. These tracks are embodied as a deposit of aluminum laid on the quartz substrate 10 which has a thickness of 125 $\mu$m, the second substrate 20 also being made of quartz with the same thickness and being glued above the tracks by means of a nonconducting resin. Each photoconductor 30 is obtained from a quartz substrate 20 mm $\times$ 20 mm with a thickness equal to 125 $\mu$m and on which 12 $\mu$m of cadmium telluride is deposited by means of a conventional technique known as OMCVD (Organometallic chemical vapor deposition). Conductive lines 14 are made from aluminum and have a thickness of 5 $\mu$m and a length of several tens of millimeters. After depositing the coating of cadmium telluride, a gold/chromium cathodic evaporation deposit is laid down in order to form the contacts, each operation being effected twice: firstly, a chrome deposit of several hundreds of Angstrom in order to facilitate catching of the gold followed by actual depositing of the gold.

So as to obtain the blocks with the desired dimensions, the plate is cut by means of a conventional saw adapted to these techniques. Secondly, the quartz block is positioned at the location of the contacts by means of a suction pump, for example. When all the photoconductors are mounted on the supports, the entire substrate 20 including the openings is covered. In order to know the sensitivity of the embodied device, a measurement is made of the lifetime of the majority carriers of a photoconductor intended to equip a unit. The other photoconductors being formed in the same way, the carriers of a given unit thus having identical lifetimes.

Figure 5:
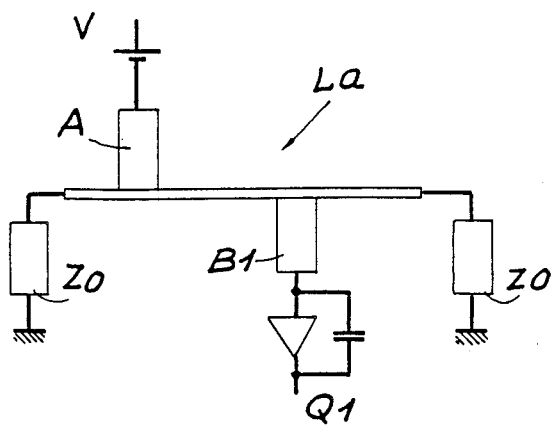
FIG. 5 shows an electrical diagram for measuring the lifetime of the carriers.

FIG. 5 shows a particular mounting example for measuring the lifetime of the majority carriers of a photoconductor intended to equip the measuring device. The measurement principle is as follows: as shown in this figure, an elementary motif of the measuring device is used. This motif comprises a photoconductor A and a photoconductor B1 connected to the line L, the line being closed via its characteristic impedance ZO. The motif is given light by very short laser pulses La. The response at the output Q1 then directly depends on the lifetime of the carriers.

The invention also concerns a method for measuring a short pulse for which the above described device is used.

According to the invention, the device makes it possible to measure points of the autocorrelation function of either a single radiation pulse (electromagnetic or ionizing) or a short electric pulse. It also makes it possible from a single pulse to be analyzed to obtain the temporal profile of this pulse when it is derived from an ionizing or electromagnetic radiation pulsed or an electric pulse. By means of this device, measurements are obtained without any temporal linearity problem occurring. In order to obtain the autocorrelation function of a short radiation pulse E(t), this pulse is emitted so that it illuminates the support SP which has a structure such as the one, for example, described on FIG. 4. The element Di has photoconductors whose majority carriers have a lifetime less than or equal to 10% of the duration of the pulse to be analyzed and shall supply p points of the autocorrelation function of this pulse.

The reference photoconductive A are each polarized by a d.c. voltage. The lines L are closed at their extremities via their characteristic impedance ZO. Each polarized photoconductor A sends onto the line L an image electric signal S(t) of the pulse E(t) so that $S(t) = K \cdot E(t)$ (S(t) is proportional to E(t). The signal S(t) polarizes the second photoconductor which generates a current i proportional to the convolution product of the pulse and its delayed image $E_1(t)$ where $E_1(t) = E(t + x/v)$. The distance x between each photoconductor is the electric path passed through by the signal S(t), namely the length of the conductive line L between each photoconductor, this length having been determined from the duration of the pulse and the number of measurement points, namely from the desired time intervals for analysis. The delay x/v is thus equal to $\theta/p$. The propagation speed v on the line is known. A charge at output Q1 for the photoconductor B1 (Qi for Bi), namely a resultant after amplification and integration of the convolution product, is collected at the output of each photoconductor. Each load collected corresponds to the measurement of a point of the autocorrelation function.

The invention also concerns a method making it possible to conduct a temporal analysis of a single short pulse by means of the device according to the invention. In order to realize this, the photoconductors A are polarized by a d.c. voltage. The lines L are closed via their characteristic impedance ZO at the two extremities. A short radiation pulse E(t) is sent which illuminates all the photoconductors and, in synchronism with the ascending front of the radiation pulse, another radiation pulse r(t) is sent whose duration is extremely short with respect to the possible duration range of the first pulse.

Figure 6:
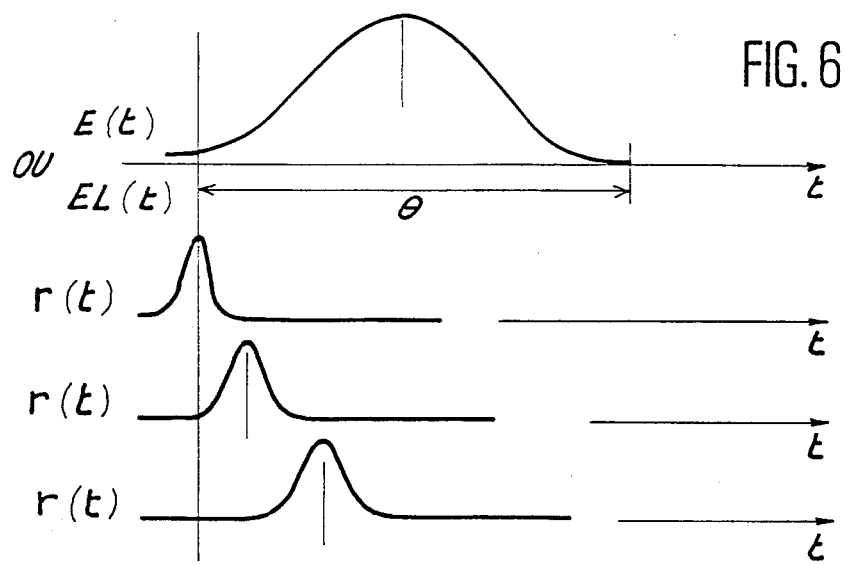
FIG. 6 shows a diagram according to the majority measuring time of a pulse according to a second and a third functioning mode.

FIG. 6 shows the pulse E(t) and the propagation of the electric image on the line L of the time controlled pulse r(t). The duration of the second pulse is less than or equal to the lifetime of the carriers of the photoconductors of the sub-assembly in question. This pulse r(t) illuminates the polarized photoconductors A. The photoconductors Bl-Bp are sequentially polarized by the signal extending onto the line and produced by this extremely short pulse. At the outputs of an element Di of the device, a set of charges is collected, said charges corresponding to a temporal sampling of the radiation pulse to be analyzed, E(t). By extending onto the line, the shortest pulse, e.g. from a stroboscope, there can be provided an exact image at p points of the profile of the pulse to be analyzed.

According to one variant, it is also possible to carry out the method inversely by sending a very short radiation pulse onto all the photoconductors and a short radiation pulse to be analyzed E(t) onto the first photoconductor.

Figure 7:
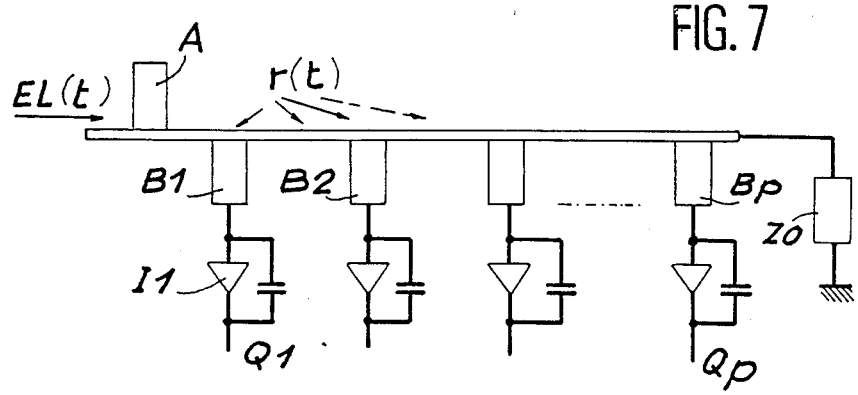
FIG. 7 shows an electrical diagram of the device according to the invention corresponding to the third functioning mode.

The invention also concerns a method making it possible to conduct a temporal analysis of a short electric pulse by means of the device according to the invention. In order to realize this, the photoconductors A are not polarized by a d.c. voltage (they can be suppressed) and the lines are reclosed via their characteristic impedance solely at one extremity, as can be seen on the diagram of FIG. 7. From their free extremity, a short electric pulse EL(t) is sent onto all the lines. In addition, in synchronism with the descending front of this electric pulse, a very short radiation pulse r(t) is sent illuminating in particular the photoconductors B. The duration of this very short radiation pulse may correspond, for example, to the lifetime of the photoconductor carriers of the sub-assembly in question. This radiation pulse induces a temporal analysis window of the pulse to be analyzed by rendering the elements Bl-Bp conductive. The polarization state of each of the various elements Bl-Bp depends on the voltage viewed at its terminals. This is directly linked to the form of the pulse EL(t) extending into the line L. At the outputs of an element Di, such as the one shown in FIG. 7, a set of charge is collected, said charges corresponding to a temporal sampling of the electric pulse. The shortest pulse (radiation) r(t), such as from a stroboscope, creates an exact image at p points of the profile of the electric pulse to be analyzed EL(t).

What is claimed is:

1. A device for measuring a single short pulse comprising at least one measuring unit suitable for carrying out p measurement points of a pulse to be analyzed of duration $\theta$ said device comprising a conductive line connected via one of its electrodes to a set of photoconductors, the line and the photoconductors being placed between two nonconductors, the length of the line separating the photoconductors two-by-two being equal to the product of the propagation speed on this line and the ratio $\theta/p$, the photoconductors being selected so that the lifetime $\tau$ of the majority carriers of these photoconductors is less than or equal to 10% of the period of the pulse to be analyzed, the device thus making it possible to introduce a delay between each photoconductor equal to the desired time interval between two successive measuring points of the pulse to be analyzed so as to obtain a temporal analysis or the autocorrelation function of either a radiation pulse or an electric pulse.

2. A short pulse measuring device according to claim 1 comprising a plurality of said measuring units for which the lifetime of the majority carriers of the photoconductors differs from one unit to another, each being suitable for carrying out p measurement points of a short pulse of determined duration.

3. A short pulse measuring device according to claim 1, wherein each measuring unit comprises p+1 photoconductors, the lifetime $\tau$ of the majority carriers of said photoconductors being less than or equal to 10% of $\theta$ so as to have p measuring points for a pulse whose duration is equal to $\theta$.

4. A short pulse measuring device according to claim 1, wherein each photoconductor includes a layer of cadmium telluride or gallium arsenide or indium phosphide.

5. A short pulse measuring method using a device according to claim 1 and consisting of closing the conductive line on which photoconductors are connected on the characteristic impedance at a single extremity of this line, a short electric pulse to be analyzed being sent onto the other extremity, a shorter radiation pulse being sent in synchronism with the descending front part of the electric pulse, a set of charges corresponding to a sampling of the electric pulse to be analyzed being obtained, each charge being recorded on one output electrodes of each photoconductor.

6. A short pulse measuring device according to claim 1 and including
- a first substrate having opposite first and second faces said first face being metallized;
- a set of conductive tracks and a conductive line on said second face, said conductive line being roughly perpendicular to said tracks and being spaced from the latter;
- a second substrate placed on said tracks and conductive line, said second substrate being coated with a metallic coating and including openings whose length is longer than the space existing between said tracks and conductive line, said photoconductors being constituted by blocks comprising a substrate, a semiconductive coating deposited on the substrate and a first and a second contact on the semiconductive coating at each of the extremities of the block, each block having dimensions enabling it to be housed inside a said opening of the second substrate;
- a first contact placed on said conductor line, and a second contact placed on one of said tracks.

7. A method for measuring a short pulse comprising the steps of
- closing the conductive line of the short pulse measuring device defined in claim 1 at each of its extremities by virtue of its characteristic impedance;
- sending a short radiation pulse, the first photoconductor being polarized by a predetermined d.c. voltage;
- sending through the line an image electric signal of the incident pulse so that $S(t)=k \cdot E(t)$, said signal polarizing the second photoconductor, said second photoconductor generating a current proportional to the convolution product of the pulse and its delayed image $E_1(t)$ where $E_1(t)=E(t+x/v)$, x being the length of the line separating these two photoconductors, v the propagation speed on the line, and x being selected so that the delay is equal to $\theta/p$, with the photoconductors bearing majority carriers whose lifetime is less than or equal to 10% of $\theta$, said signal successively polarizing in the same way all the other photoconductors with a delay increased each time by $\theta/p$, and
- collecting a charge resultant of said convolution products at the output of each photoconductor except for the first one, each charge thus providing the measurement of a point of the autocorrelation function of the pulse to be measured.

8. A method for measuring a short pulse comprising the steps of
- closing the conductive line of the short pulse measuring device defined in claim 1 at its two extremities by virtue of its characteristic impedance;
- sending a short radiation pulse to be analyzed lighting all of the photoconductors;
- sending in synchronism with said pulse a shorter radiation pulse whose duration is less than or equal to the lifetime concerning the first photoconductor, said first photoconductor being polarized by a predetermined d.c. voltage, and obtaining a set of charges corresponding to a temporal sampling of the radiation pulse to be analyzed, each charge being recovered on an output electrode of each photoconductor except the first one.

9. The measurement method according to claim 8, wherein said short radiation pulse to be analyzed is sent onto the first photoconductor and said shorter pulse, whose duration is less than or equal to 6, onto all the photoconductors.

10. A method for measuring a short pulse comprising the steps of
- closing the conductive line connected to p photoconductors of the short pulse measuring device defined in claim 1;
- sending via its characteristic impedance at a single extremity a short electric pulse to be analyzed onto the other extremity; and
- sending a shorter radiation pulse onto said photoconductors in synchronism with the descending front part of the electric pulse thereby obtaining a set of charges corresponding to a sampling of the electric pulse to be analyzed, each charge being recovered on one output electrode of each photoconductor.

* * * * *